(12) United States Patent
Negishi et al.

(10) Patent No.: US 7,709,832 B2
(45) Date of Patent: May 4, 2010

(54) ORGANIC COMPOUND AND ORGANIC LIGHT-EMITTING ELEMENT

(75) Inventors: Chika Negishi, Yokosuka (JP); Takao Takiguchi, Tokyo (JP); Satoshi Igawa, Fujisawa (JP); Jun Kamatani, Tokyo (JP); Naoki Yamada, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 306 days.

(21) Appl. No.: 11/736,862

(22) Filed: Apr. 18, 2007

(65) Prior Publication Data

US 2007/0252141 A1  Nov. 1, 2007

(30) Foreign Application Priority Data

Apr. 25, 2006  (JP)  .............................. 2006-120805
Apr. 28, 2006  (JP)  .............................. 2006-125012

(51) Int. Cl.
*H01L 35/24* (2006.01)
*H01L 51/00* (2006.01)

(52) U.S. Cl. .................. 257/40; 257/E51.001; 585/484

(58) Field of Classification Search .................. 257/40; 585/484
See application file for complete search history.

(56) References Cited

U.S. PATENT DOCUMENTS

| 6,652,997 | B2 | 11/2003 | Suzuki et al. |
| 2004/0265632 | A1 | 12/2004 | Okinaka et al. |
| 2006/0068221 | A1 | 3/2006 | Saitoh et al. |

FOREIGN PATENT DOCUMENTS

JP  10189248  7/1998

OTHER PUBLICATIONS

McElvain et al, "Fullerene-based polymer grid triodes," J. Appl. Phys. 81 (9), May 1, 1997, pp. 6468-6472.*
Yu et al, "High sensitivity photodetectors made with charge transfer polymer blends," SPIE vol. 2999, pp. 306-314.*
Janssen et al, "Photoinduced electron transfer form pi-conjugated polymers onto Buckminsterfullerene, fulleroids, and methanofullerene," J. Chem.Phys. vol. 103, No. 2, Jul. 8, 1995, pp. 788-793.*
Hasharoni et al, "Near IR photoluminescence in mixed films of conjugated polymers and fullerenes," J. Chem. Phys. 107(7), Aug. 15, 1997, pp. 2308-2312.*
Brabec et al, "Investigation of photoexcitations of conjugated polymer/fullerene composites embedded in conventional polymers," J. Chem. Phys. vol. 109, No. 3, Jul. 15, 1998, pp. 1185-1195.*
Yu et al, "Large area, full color, digital image sensors made with semiconducting polymers," Synthetic metals 111-112 (2000) 133-137.*
Brabec et al, "Tracing photoinduced electron transfer process in conjugated polymer/fullerene bulk heterojunctions in real time," Chemical Physics Letters 340 (2001) 232-236.*

(Continued)

*Primary Examiner*—Kenneth A Parker
*Assistant Examiner*—Anthony Ho
(74) *Attorney, Agent, or Firm*—Fitzpatrick, Cella, Harper & Scinto

(57) ABSTRACT

A fluoranthene compound has 6 fused rings. An organic light-emitting element uses the fluoranthene compound.

6 Claims, 3 Drawing Sheets

OTHER PUBLICATIONS

Godovsky et al, "The use of combinatorial materials development for polymer solar cells," Advanced Material for Optics and Electronics, 10, 47-54 (2000).*

Vincett et al., "Electrical Conduction and Low Voltage Blue Electroluminescence in Vacuum-Deposited Organic Films," [Thin Solid Films], vol. 94, 171-183 (1982).

Chen et al., "Recent Developments in Molecular Organic Electroluminescent Materials," [Macromol. Symp.], vol. 125, 1-48 (1997).

Burroughes et al., "Light-emitting Diodes Based on Conjugated Polymers," [Nature], vol. 347, 539-541 (1990).

Kajigaeshi et al., "Halogenation Using Quaternary Ammonium Polyhalides. XIV. Aromatic Bromination and Iodination of Arenes by Use of Benzyltrimethylammonium Polyhalides-Zinc Chloride System," [Bull. Chem. Soc. Jpn], vol. 62, 439-443 (1989).

Chemische Berichte, (1966) 99 (10) pp. 3298-3303.

* cited by examiner

ORGANIC COMPOUND AND ORGANIC LIGHT-EMITTING ELEMENT

BACKGROUND OF THE INVENTION

Field of the Invention

The present invention relates to a novel organic compound and an organic light-emitting element, and more specifically to an organic light-emitting element that emits light when an electric field is applied to a thin film layer of an organic compound.

An older type of organic light-emitting element emits light when a voltage is applied to a vapor-deposited anthracene layer (Thin Solid Films, 94 (1982) 171).

In general, an organic EL element includes an upper and a lower electrode formed on a transparent substrate, and organic layers including a light-emitting layer disposed between these two electrodes, as described in Macromol. Symp. 125, 1-48 (1997).

A wide spectrum of light can be emitted from ultraviolet light to infrared light by changing the type of fluorescent organic compound. Accordingly, various types of organic compounds have been studied actively.

In addition to the above-mentioned organic light-emitting element using a low molecular weight compound, an organic light-emitting element using a conjugated polymer has been reported by a group at Cambridge University in Nature, 347, 539 (1990). In this report, it has been confirmed that a single layer of poly(phenylene vinylene) (PPV) coating emits light.

There have been significant strides made in the study of organic light-emitting elements. Organic light-emitting elements can achieve a thin, lightweight, fast-response light-emitting element capable of achieving high-luminance light emission in a wide range of wavelengths at a low applied voltage, and have a possibility of wide applications.

However more high-luminous light emission or higher conversion efficiency is required in practice. In addition, organic light-emitting elements have disadvantages of, for example deteriorating under long-term use, or due to an oxygen-containing gas or moisture, and are thus less durable. Furthermore, for use in a color display or the like requiring pure blue, green, and red light emission, satisfactory light emitters are not yet available.

For fluorescent organic compounds used in the electron transport layer or light-emitting layer, a variety of organic compounds, such as aromatic compounds and condensed polycyclic aromatic compounds, have been studied, but a compound has not yet been uncovered which emits light having satisfying luminance and durability.

Japanese Patent Laid-Open No. 10-189248 has disclosed an application of fluoranthene derivatives to an organic EL element. However, fluoranthene derivatives prepared by introducing a phenyl group to the 3- or 8-position of fluoranthene to form a ring with a carbon-carbon bond between the phenyl group and an adjacent substituting position have not been disclosed.

SUMMARY OF THE INVENTION

The present invention provides a novel fluoranthene derivative.

The invention also provides an organic light-emitting element using a specific fluoranthene derivative and emitting high-luminance light with an extremely high efficiency. In addition, a highly durable organic light-emitting element is provided. Furthermore, the organic light-emitting element can be easily produced at relatively low cost.

According to an aspect of the invention, an organic compound expressed by general formula [1] is provided:

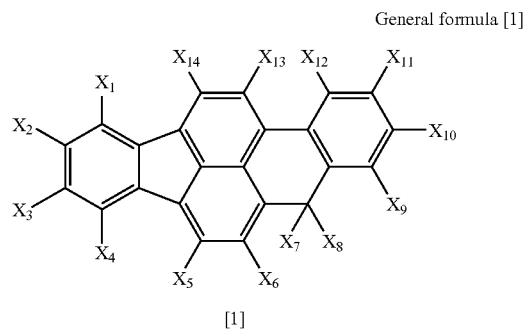

General formula [1]

[1]

In the formula, $X_1$ to $X_{14}$ each represent a substituent selected from the group consisting of hydrogen, halogens, straight-chain alkyl, branched alkyl, cyclic alkyl, substituted or unsubstituted aryl, substituted or unsubstituted alkoxy, substituted or unsubstituted heterocyclic, substituted or unsubstituted amino, and substituted or unsubstituted cyano. $X_1$ to $X_{14}$ may be the same or different. Any adjacent alkyl and aryl groups of $X_1$ to $X_4$ may form a ring.

According to another aspect of the invention, an organic light-emitting element is provided which includes a pair of anode and cathode, and an organic compound layer disposed between the anode and the cathode. At least one of the anode and the cathode is transparent or semi-transparent. The organic compound layer contains the organic compound expressed by general formula [1].

According to another aspect of the invention, an organic light-emitting element is provided which includes a pair of anode and cathode, and organic compound layers including a light-emitting layer. At least one of the anode and the cathode is transparent or semi-transparent. The light-emitting layer contains the compound expressed by general formula [1].

The present invention can provide a novel organic compound expressed by general formula [1]. The organic compound can be suitably used as a constituent of the organic light-emitting element. The present invention can also provide an organic light-emitting element using the novel organic compound, and the organic light-emitting element can be efficiently emit light at a low applied voltage and exhibit high durability.

Further features of the present invention will become apparent from the following description of exemplary embodiments with reference to the attached drawings.

DESCRIPTION OF THE EMBODIMENTS

Figure 1:
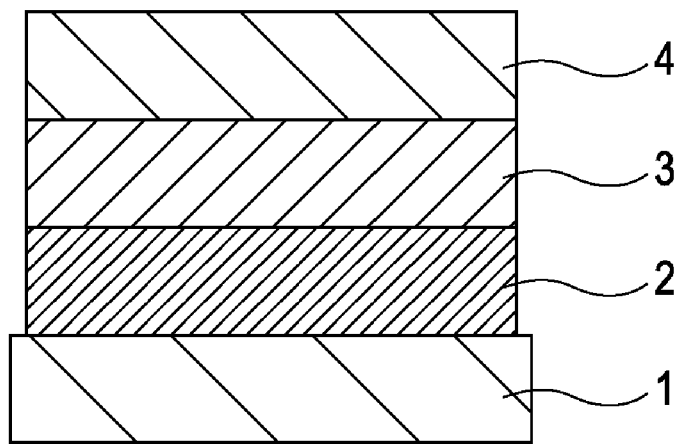
FIG. 1 is a sectional view of an organic light-emitting element according to an embodiment of the invention.

The invention provides an organic compound expressed by general formula [1]:

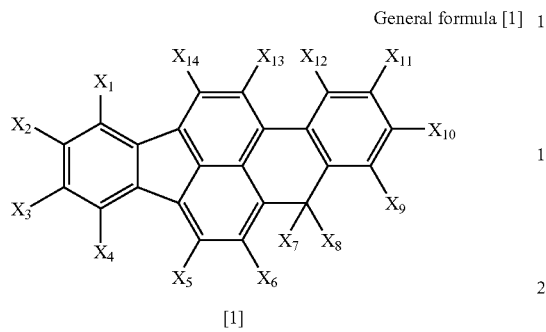

General formula [1]

In the formula, $X_1$ to $X_{14}$ each represent a hydrogen atom, a halogen atom, a straight-chain, branched, or cyclic alkyl group, or a substituted or unsubstituted aryl, alkoxy, heterocyclic, amino, or cyano group. $X_1$ to $X_{14}$ may be the same or different. Any adjacent alkyl and aryl groups of $X_1$ to $X_4$ may form a ring.

An organic light-emitting element according to an embodiment of the invention includes a pair of anode and cathode, at least one of which is transparent or semi-transparent, and at least one organic compound layer disposed between the anode and the cathode. The organic compound layer includes a layer containing at least one organic compound expressed by general formula [1].

An organic light-emitting element according to another embodiment of the invention includes a pair of anode and cathode, at least one of which is transparent or semi-transparent, and a plurality of organic compound layers including a light-emitting layer. The light-emitting layer contains at least one organic compound expressed by general formula [1].

The compound expressed by general formula [1] can be used as a constituent of an organic light-emitting element. In particular, the compound can be used for the light-emitting layer of an organic light-emitting element. In this instance, the compound can be used solely, or as a dopant (guest) or a host material, thereby achieving an element exhibiting a high color purity, a high luminous efficiency, and a long lifetime.

The compound expressed by general formula [1] has a ring formed with a carbon-carbon bond between a phenyl group introduced to the 3-position of fluoranthene and an adjacent substitution position of the fluoranthene. Consequently, molecular vibration in the compound is suppressed to prevent thermal inactivation. Thus, the compound can be a material achieving a high quantum yield.

The HOMO/LUMO energy level of the material can be controlled by converting a substituent, so that blue, green, or red light can be emitted. In addition, since the HOMO/LUMO energy level can be estimated by calculation, molecular design can be easily made taking into account the energy gaps of the host material, the hole transport layer, and the electron transport layer. Thus, the present invention has been accomplished.

If the compound is used as dopant, the dopant content can be 0.01% to 80% relative to the host material, and preferably 1% to 40%. The dopant (1) may be uniformly dispersed in the entire host material layer, (2) has a concentration gradient in the host material layer, or (3) be partially contained in a region of the host material layer with a dopant-free region.

The compound will now be described in detail.

Substituents of general formula [1] are listed as follows:

Alkyl groups include, but not limited to, methyl, ethyl, n-propyl, isopropyl, n-butyl, isobutyl, sec-butyl, tert-butyl, n-pentyl, isopentyl, neopentyl, tert-pentyl, cyclopentyl, n-hexyl, 2-ethylbutyl, 3,3-dimethylbutyl, cyclohexyl, n-heptyl, cyclohexylmethyl, n-octyl, tert-octyl, 2-ethylhexyl, n-nonyl, n-decyl, n-dodecyl, n-tetradecyl, and n-hexadecyl.

Substituted or unsubstituted alkoxy groups include, but not limited to, methoxy, ethoxy, n-propoxy, isopropoxy, n-butoxy, isobutoxy, sec-butoxy, n-pentyloxy, neopentyloxy, cyclopentyloxy, n-hexyloxy, 2-ethylbutoxy, 3,3-dimethylbutyloxy, cyclohexyloxy, n-heptyloxy, n-octyloxy, 2-ethylhexyloxy, n-nonyloxy, n-decyloxy, n-dodecyloxy, n-tetradecyloxy, and n-hexadecyloxy.

Substituted or unsubstituted aryl groups include, but not limited to, phenyl, naphthyl, pentalenyl, pyrenyl, anthryl, indenyl, azulenyl, indacenyl, acenaphthenyl, phenanthryl, phenalenyl, fluoranethenyl, acephenanthryl, aceanthryl, triphenylenyl, chrysenyl, naphthacenyl, perylenyl, pentacenyl, biphenyl, terphenyl, and fluorenyl.

Substituted or unsubstituted heterocyclic groups include, but not limited to, thienyl, pyrrolyl, pyridyl, oxazolyl, oxadiazolyl, thiazolyl, thiadiazolyl, terthienyl, carbazolyl, acridinyl, and phenanthrolyl.

Substituted or unsubstituted amino groups are expressed by —NR'R", and R' and R" are hydrogen; heavy hydrogen; the above-listed substituted or unsubstituted alkyl, aralkyl, aryl, and heterocyclic groups; alkylene, alkenylene, alkynylene, aralkylene, and amino groups having a linking group formed with a substituted or unsubstituted arylene group or a divalent heterocyclic group; substituted silyl groups; and ether, thioether, and carbonyl groups. For example, R' and R" include, but are not limited to, amino, N-methylamino, N-ethylamino, N,N-dimethylamino, N,N-diethylamino, N-methyl-N-ethylamino, N-benzylamino, N-methyl-N-benzylamino, N,N-dibenzylamino, aniline, N,N-diphenylamino, N-phenyl-N-tolylamino, N,N-ditolylamino, N-methyl-N-phenylamino, N,N-dianisolylamino, N-mesityl-N-phenylamino, N,N-dimesitylamino, N-phenyl-N-(4-tert-butylphenyl)amino, and N-phenyl-N-(4-trifluoromethylphenyl)amino.

Halogen atoms include fluorine, chlorine, bromine, and iodine. Among these preferred are fluorine, chlorine, and bromine, and most preferred are fluorine and chlorine. Among the above-listed substituents the preferred ones are hydrogen, fluorine, chlorine, alkyl groups having a carbon number of 1 to 10, alkoxy groups having a carbon number of 1 to 10, and more preferably hydrogen, fluorine, chlorine, alkyl groups having a carbon number of 1 to 6, and alkoxy groups having a carbon number of 1 to 6.

Examples of the compound expressed by general formula [1] will be shown, but not limited to, below.

Exemplary compounds include the following exemplary compounds 1 to 56:

1
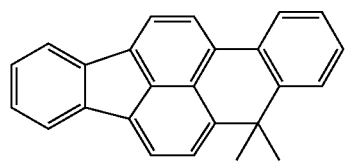
2
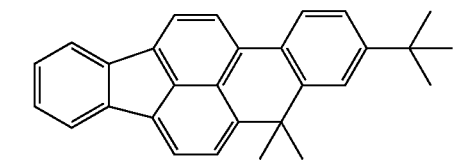
3
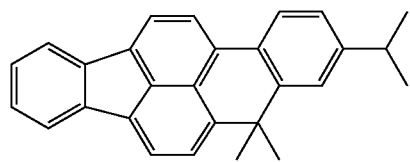
4
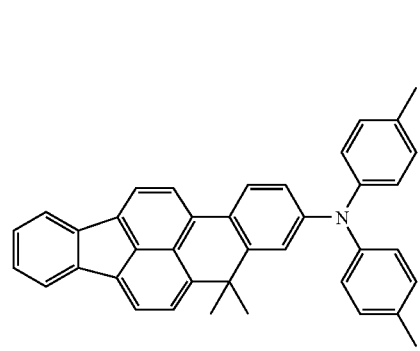
5
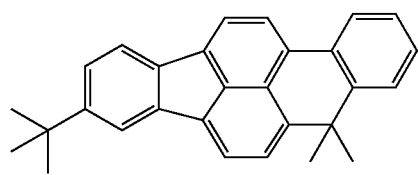
6
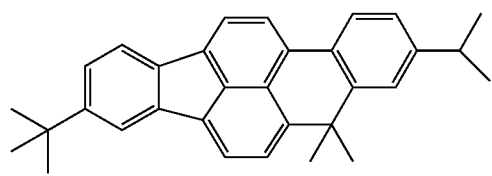
7
8
9
10
11
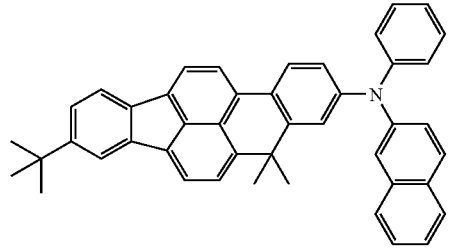
12
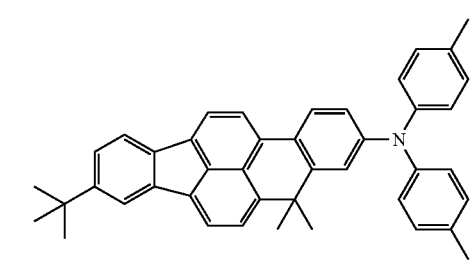

-continued
13
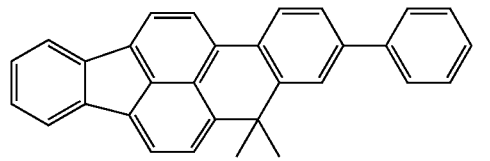
14
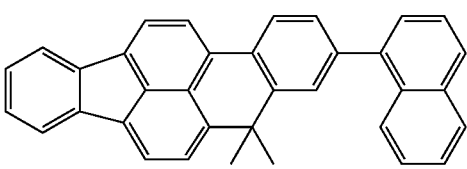
15
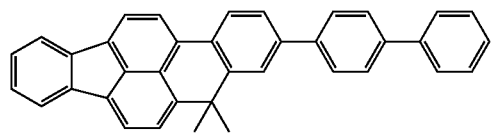
16
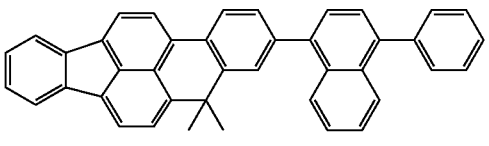
17
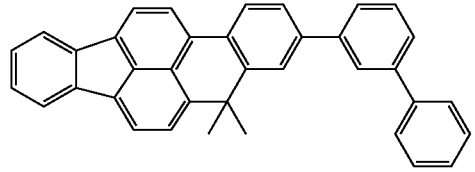
18
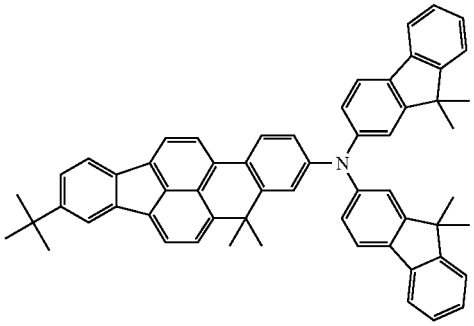
19
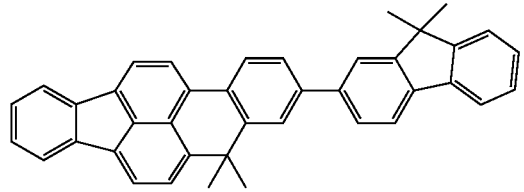
20
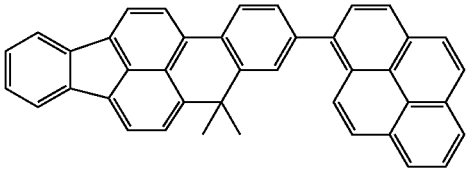
21
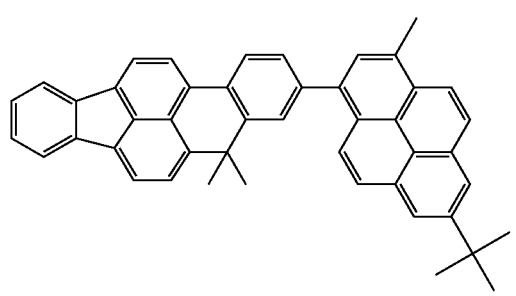
22
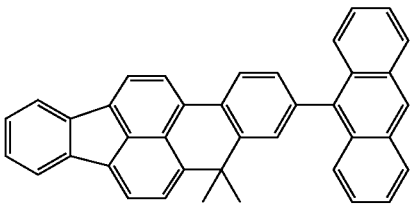
23
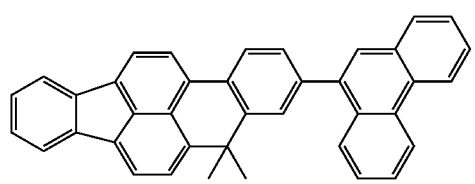
24
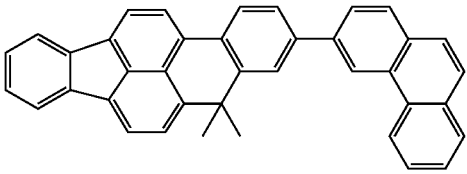
25
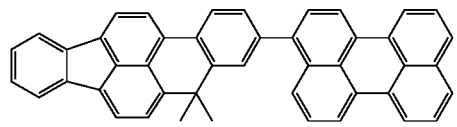
26
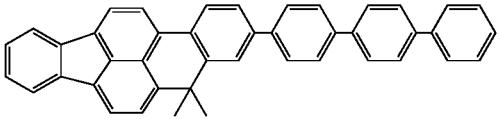

-continued
27
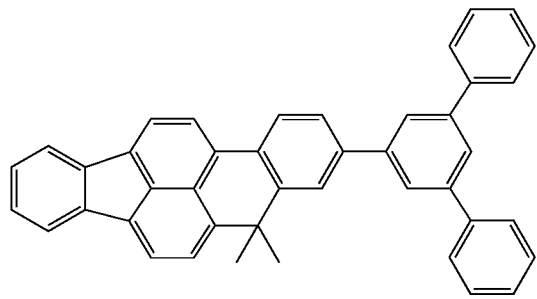
28
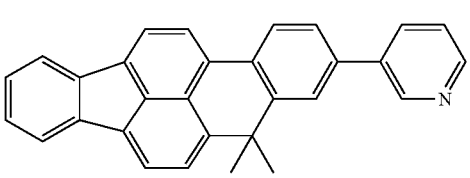
29
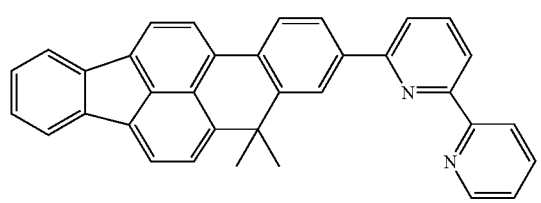
30
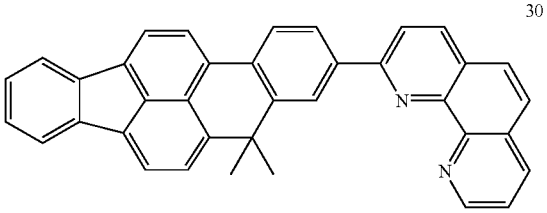
31
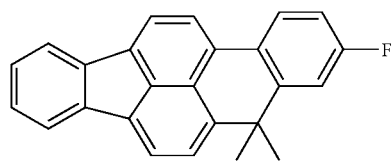
32
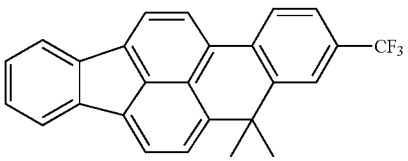
33
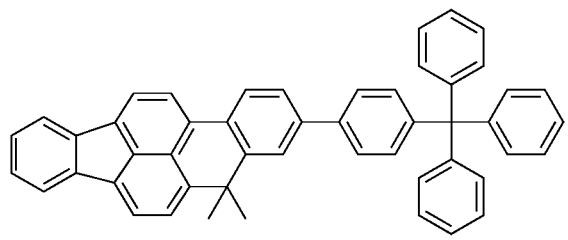
34
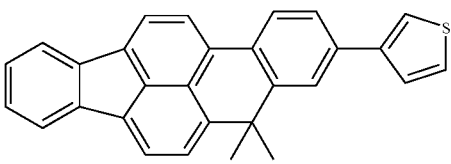
35
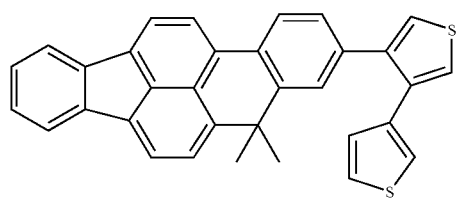
36
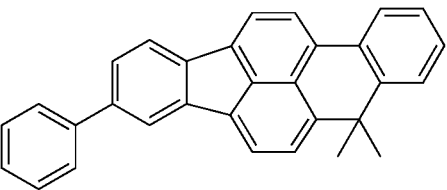
37
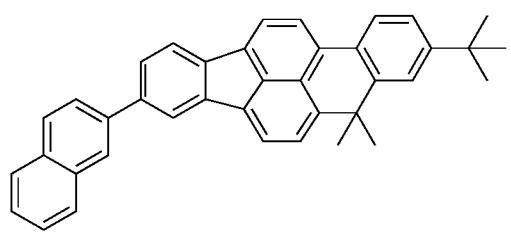
38
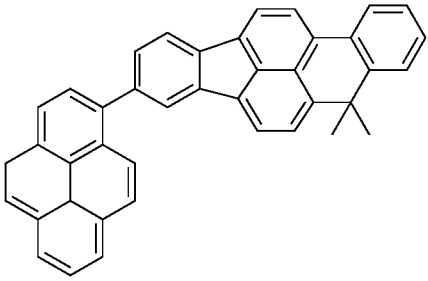

-continued
39
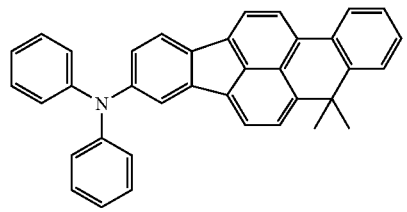
40
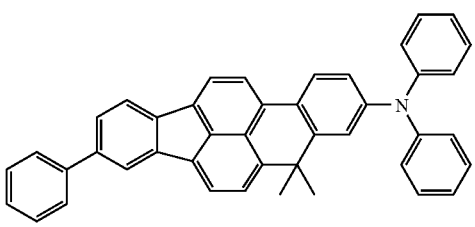
41
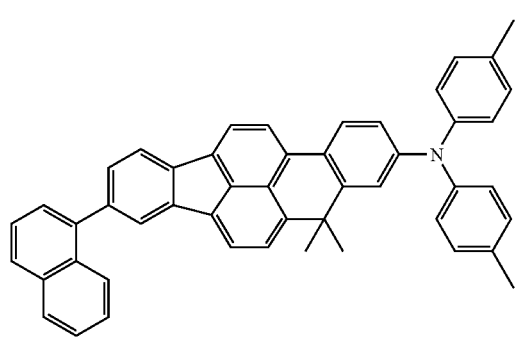
42
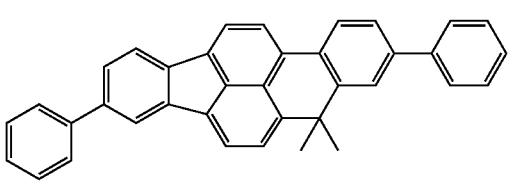
43
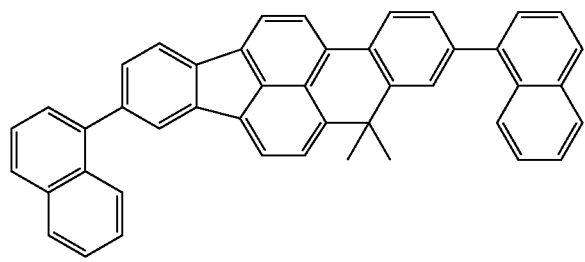
44
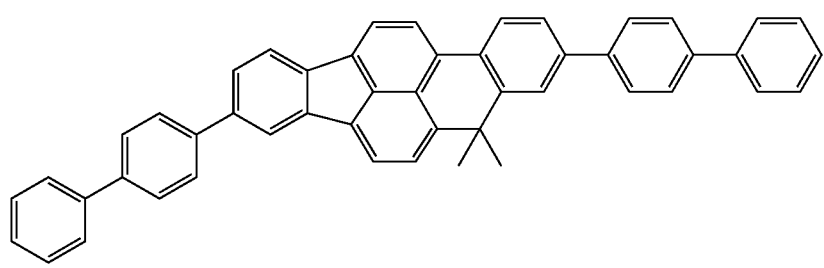
43
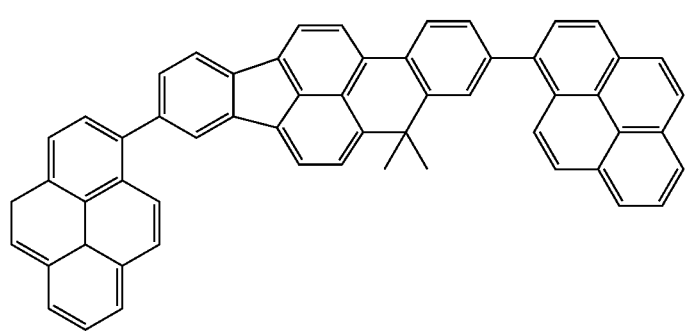

-continued
44
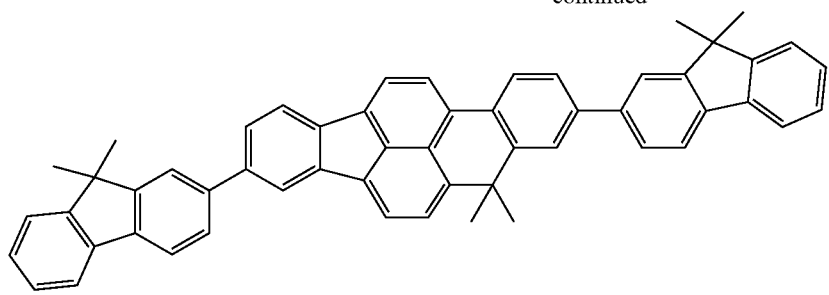
45
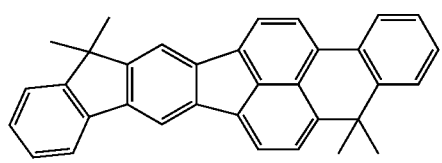
46
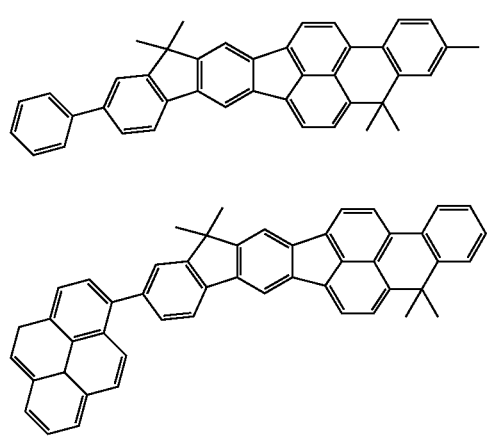
47
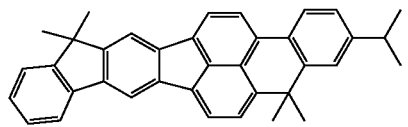
49
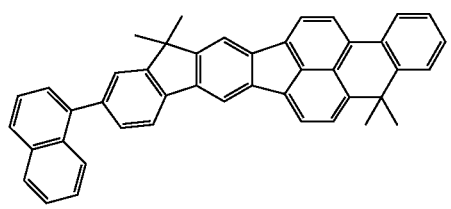
51
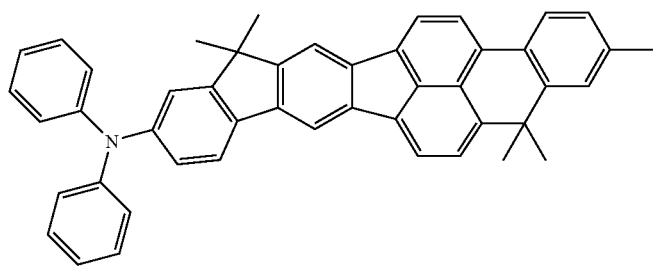
52
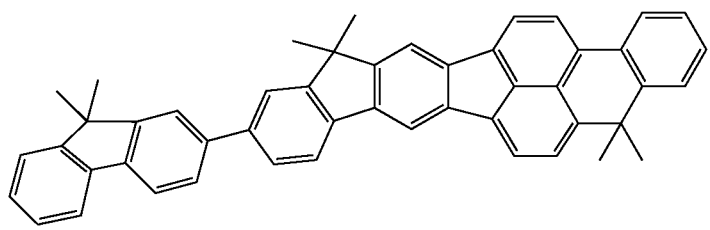
53
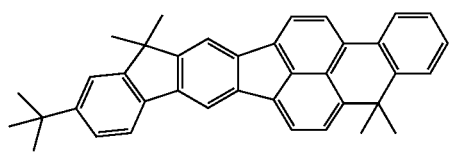
54
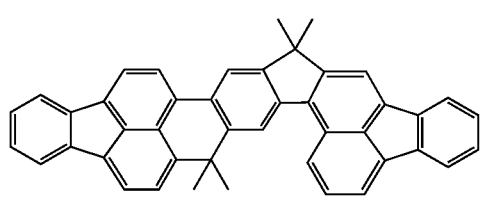

-continued

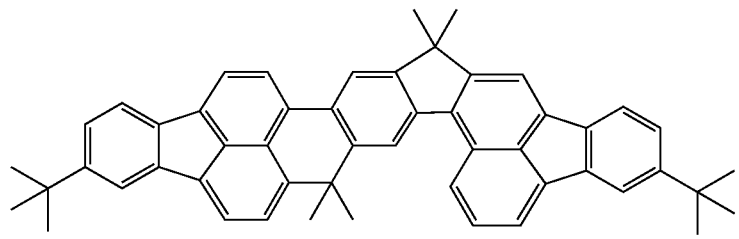
53

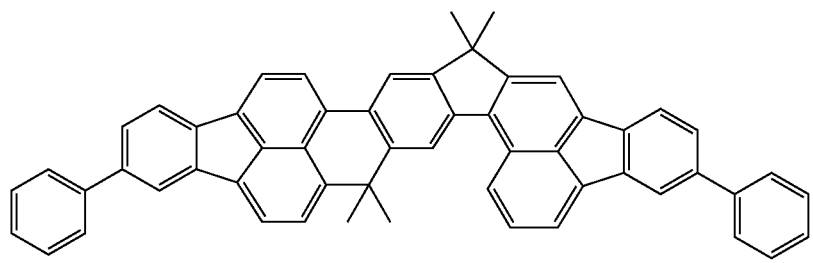
55

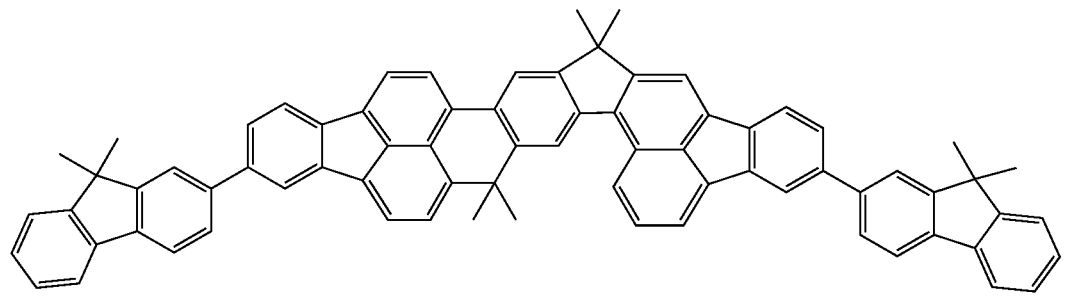
56

The organic light-emitting element of the invention will now be described with reference to embodiments.

The organic light-emitting element includes a pair of anode and cathode, and an organic compound layer disposed between the anode and the cathode, and the organic compound layer contains the compound expressed by general formula [1].

FIGS. 1 to 5 show preferred embodiments of the organic light-emitting element.

In the figures, reference numeral 1 designates a substrate; 2, an anode; 3, a light-emitting layer; 4, a cathode; 5, a hole transport layer; 6, an electron transport layer; 7, a hole injection layer; and 8, a hole/exciton blocking layer.

FIG. 1 is a sectional view of an organic light-emitting element according to an embodiment of the invention. The organic light-emitting element shown in FIG. 1 has the structure in which an anode 2, a light-emitting layer 3, and a cathode 4 are disposed in that order on a substrate 1. This structure is suitable for elements in which the organic compound solely has the abilities of transporting holes, transporting electrons, and emitting light, or is mixed with other compounds having those abilities.

Figure 2:
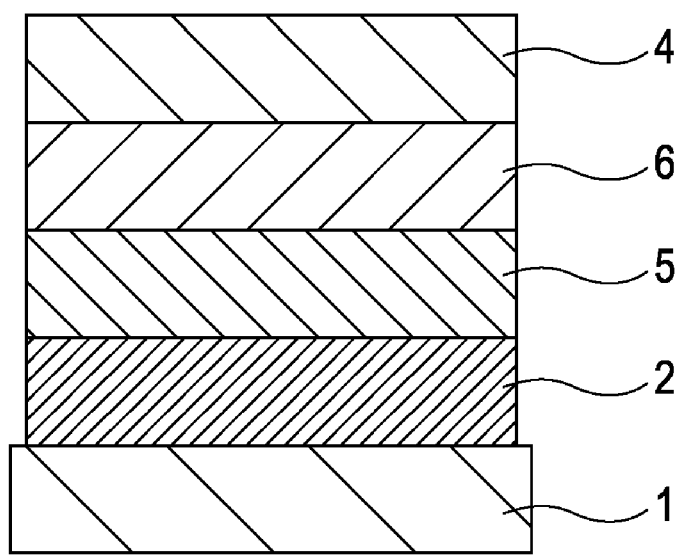
FIG. 2 is a sectional view of an organic light-emitting element according to another embodiment of the invention.

FIG. 2 is a sectional view of an organic light-emitting element according to a second embodiment of the invention. The organic light-emitting element shown in FIG. 2 has the structure in which an anode 2, a hole transport layer 5, an electron transport layer 6, and a cathode 4 are disposed in that order on a substrate 1. This structure is suitable for elements in which the light-emitting material has either or both of the abilities of transporting holes and electrons and is appropriately used in the hole-transport layer or the electron-transport layer in combination with a suitable non-light-emitting hole transport material or electron transport material. In this instance, either the hole transport layer 5 or the electron transport layer 6 serves as the light-emitting layer.

Figure 3:
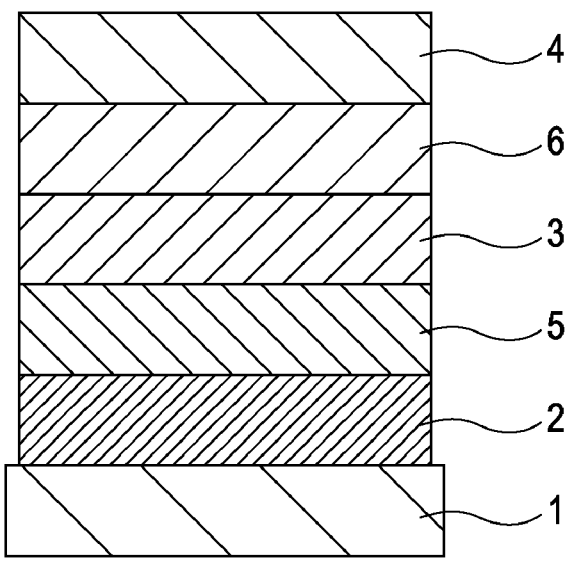
FIG. 3 is a sectional view of an organic light-emitting element according to another embodiment of the invention.

FIG. 3 is a sectional view of an organic light-emitting element according to a third embodiment of the invention. The organic light-emitting element shown in FIG. 3 has the structure in which an anode 2, a hole transport layer 5, a light-emitting layer 3, an electron transport layer 6, and a cathode 4 are disposed in that order on a substrate 1. In this structure, the functions of transporting carriers and of emitting light are assigned to different layers, and compounds having the ability of transporting holes, transporting electrons, or emitting light are used in appropriate combination. This structure thus offers a wide range of choices in material and allows the use of various compounds having different light emission wavelengths, thus achieving a spectrum of color emissions. In addition, carriers or excitons may be confined in the light-emitting layer 3 in the middle of the organic compound layers to increase the luminous efficiency.

Figure 4:
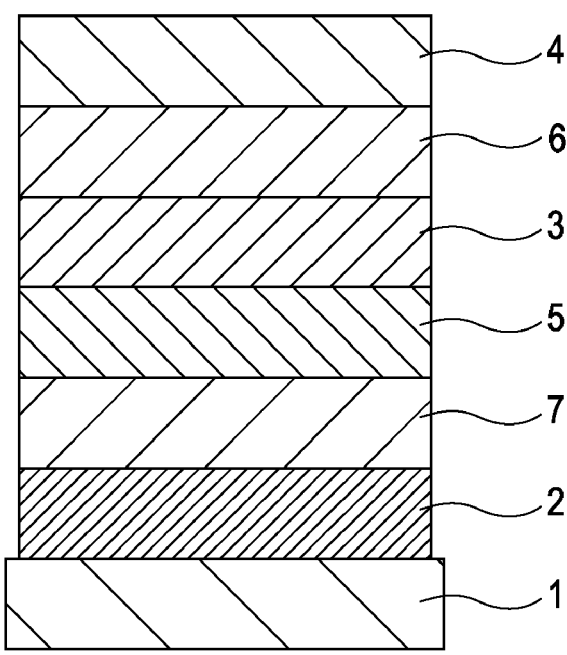
FIG. 4 is a sectional view of an organic light-emitting element according to another embodiment of the invention.

FIG. 4 is a sectional view of an organic light-emitting element according to a fourth embodiment of the invention. The organic light-emitting element shown in FIG. 4 has the structure in which a hole injection layer 7 is added to the structure shown in FIG. 3 so as to be disposed on the anode 2 side. This structure can enhance the adhesion between the anode 2 and the hole transport layer 5 or improve the hole injection, and thus can lower the driving voltage.

Figure 5:
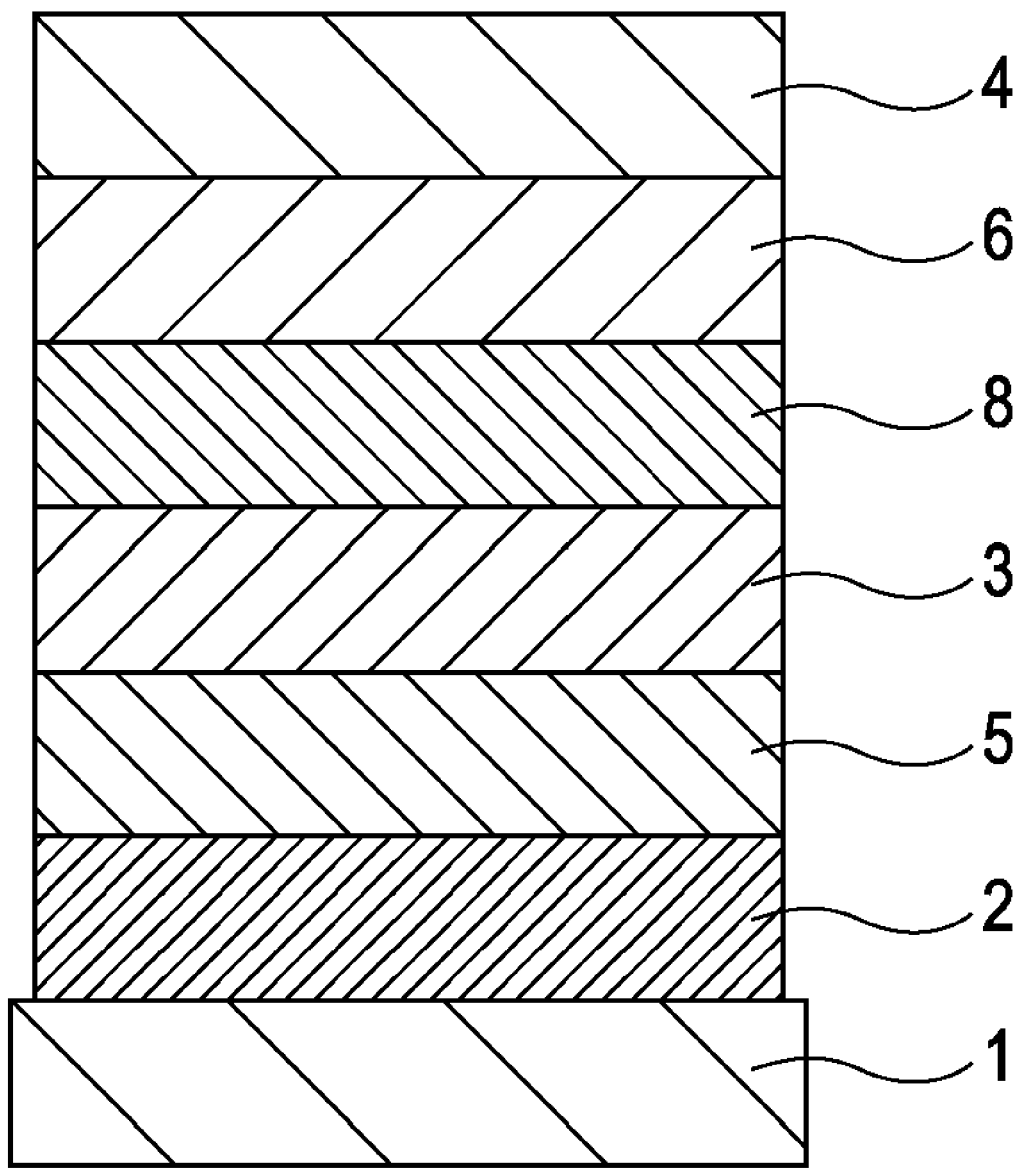
FIG. 5 is a sectional view of an organic light-emitting element according to another embodiment of the invention.

FIG. 5 is a sectional view of an organic light-emitting element according to a fifth embodiment of the invention. The organic light-emitting element shown in FIG. 5 has the structure in which a layer 8 for inhibiting holes or excitons from escaping toward the cathode 4. The hole/exciton blocking layer 8 is added to the structure shown in FIG. 3 so as to be disposed between the light-emitting layer 3 and the electron transport layer 6. By forming the hole/exciton blocking layer 8 of a compound having a very high ionization potential, the luminous efficiency can be enhanced.

FIGS. 1 to 5 show fundamental structures of the organic light-emitting element. However the organic light-emitting element using the organic compound of the invention is not limited to those structures. For example, the organic light-emitting element may further include an insulating layer between an electrode and an organic layer. In addition, an adhesive layer or an interference layer may be added. The hole transport layer may be constituted of two layers having different ionization potentials. Thus, a variety of layer arrangements can be made.

The compound expressed by general formula [1] can be used in any one of the structures shown in FIGS. 1 to 5.

The organic compound layer containing the compound expressed by general formula [1] can be used as the light-emitting layer, the electron transport layer, or the hole transport layer. By forming the organic compound layer by vacuum vapor deposition or liquid coating, crystallization of the layer can be prevented, and thus the resulting layer can be stable over time.

In particular, the light-emitting layer contains the compound expressed by general formula [1], and a known low-molecular weight material or polymeric material which is, for example, a hole transporting compound, light-emitting compound, or electron transporting compound may be combined, if necessary.

Examples of such compounds used with the compound expressed by general formula [1] will be listed below.

It is desired that the material for injecting and transporting holes facilitates the injection of holes from the anode and provides such a high mobility that the injected holes are transported to the light-emitting layer. Examples of such low-molecular-weight or polymer materials having the ability of injecting and transporting holes include, but not limited to, triarylamine derivatives, phenylenediamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, and conductive polymers, such as poly(vinylcarbazole), poly(silylene), and poly(thiophene). Some of the hole injection transport materials are shown below:

Low-Molecular-Weight Hole Injection Transport Materials

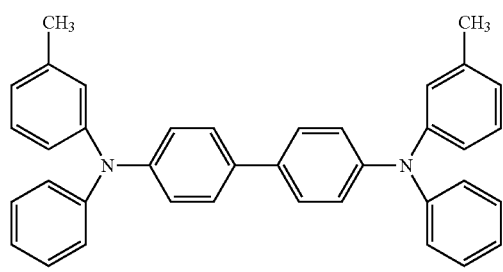

TPD

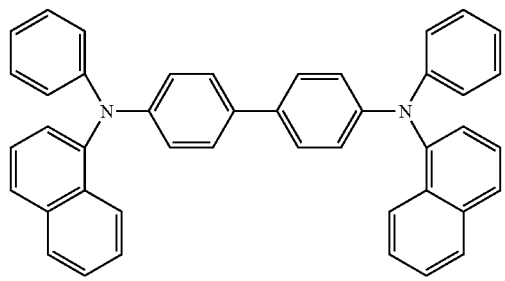

α-NPD

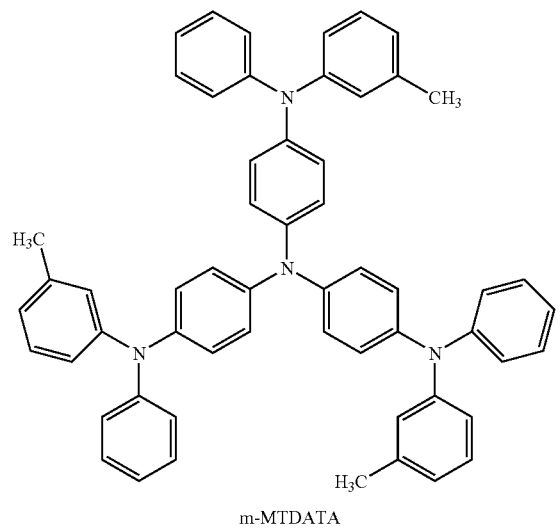

m-MTDATA

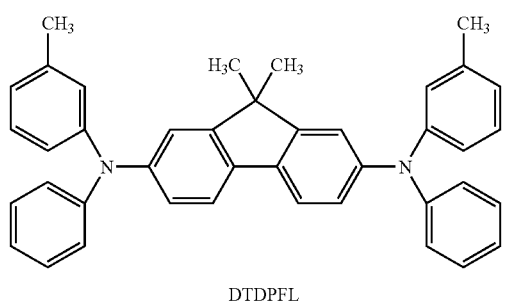

DTDPFL

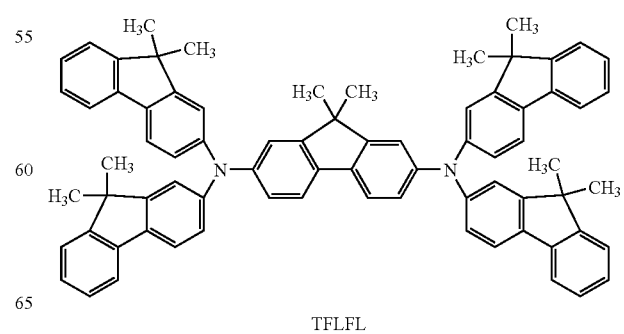

TFLFL

-continued
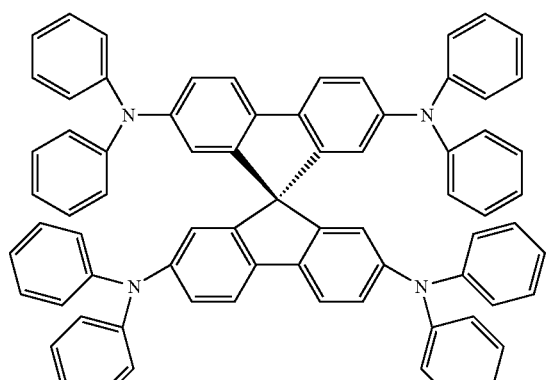
spiro-TPD
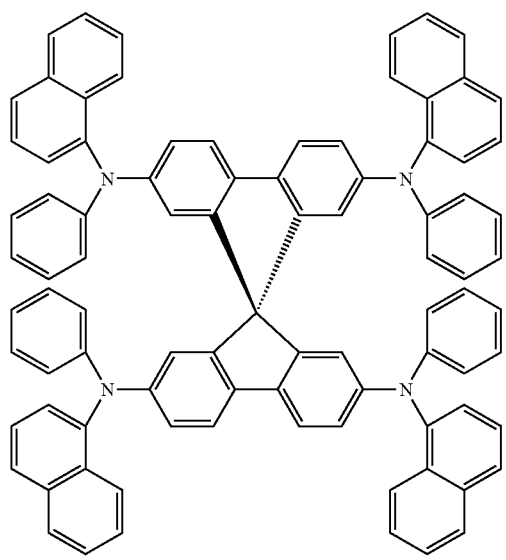
spiro-NPD
-continued
TPAC
PDA
Pc-M
M: Cu, Mg, AlCl, TiO, SiCl2, Zn, Sn, MnCl, GaCl, etc
Polymer Hole Transport Materials
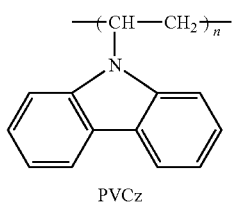
PVCz
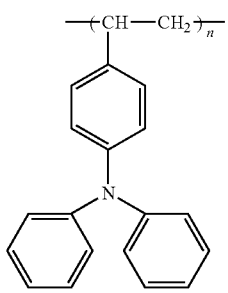
DPA-PS -continued
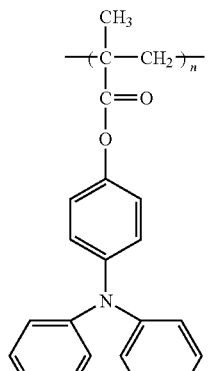
TPA-PMMA
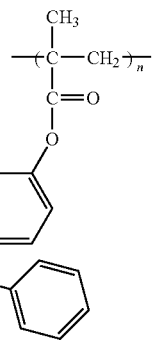
TPA-FMMA
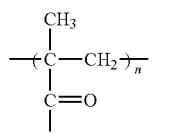
Poly thiophene
R: C5H13, C8H17, C12H25
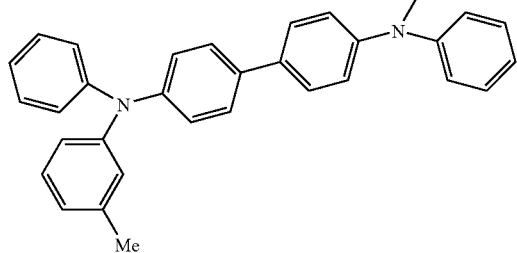
TPD-PMAA
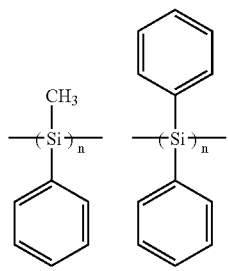
Polysilene
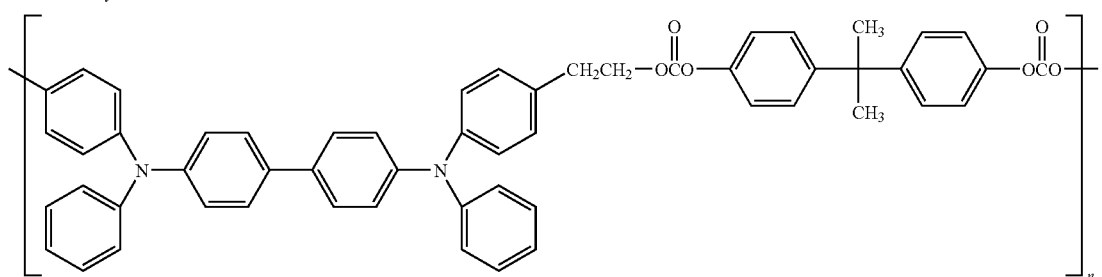
TPD-PCA Materials chiefly responsible for the function of emitting light used in combination with the organic compound expressed by general formula [1] include: condensed polycyclic aromatic compounds, such as naphthalene derivatives, phenanthrene derivatives, fluorene derivatives, pyrene derivatives, tetracene derivatives, coronene derivatives, chrysene derivatives, perylene derivatives, 9,10-diphenylanthracene derivatives, and rubrene; quinacridone derivatives; acridone derivatives; coumarin derivatives; pyran derivatives; nile red; pyrazine derivatives; benzoimidazole derivatives; benzothiazole derivatives; benzooxazole derivatives; stilbene derivatives; organic metal complexes, such as tris(8-quinolinolate) aluminum, other organic aluminum complexes, and organic beryllium complexes; and polymer derivatives, such as poly(phenylene vinylene) derivatives, poly(fluorene) derivatives, poly(phenylene) derivatives, poly(thienylenevinylene) derivatives, and poly(acetylene) derivatives. Some of these compounds will be shown below:

Low-Molecular-Weight Light-Emitting Materials

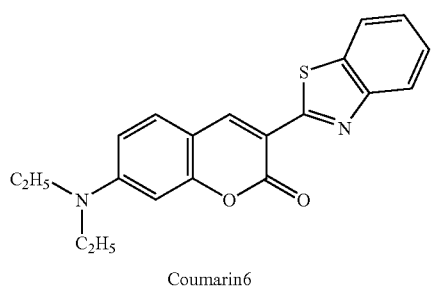

Coumarin6

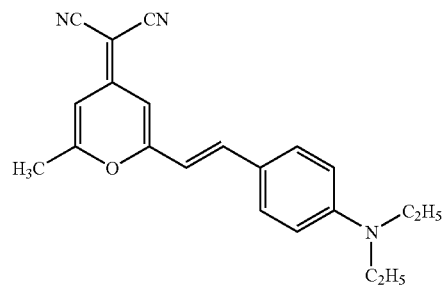

DCM-1

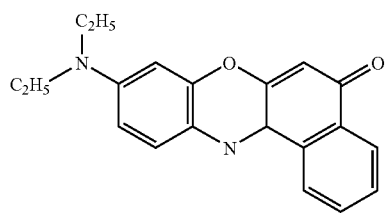

Nile Red

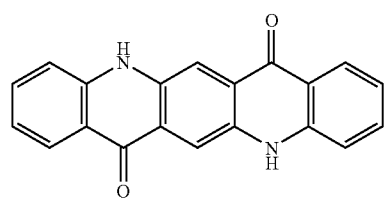

Quinaczidone

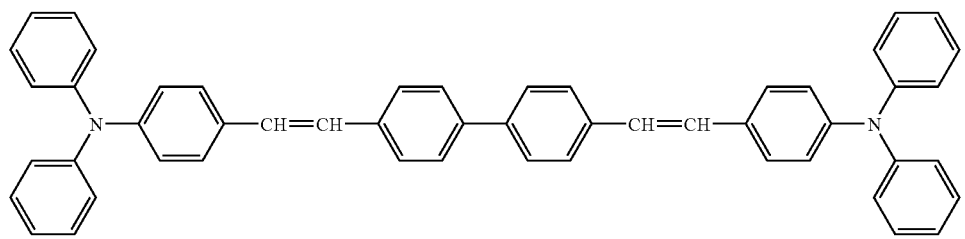

DTPABVi

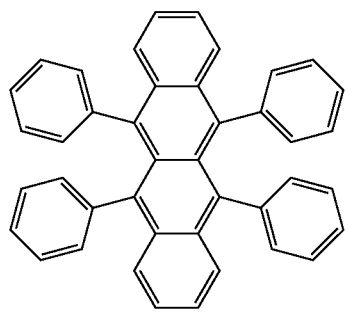

Rubrene

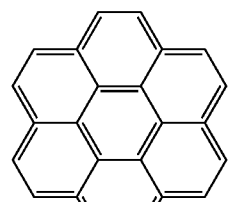

Coronene

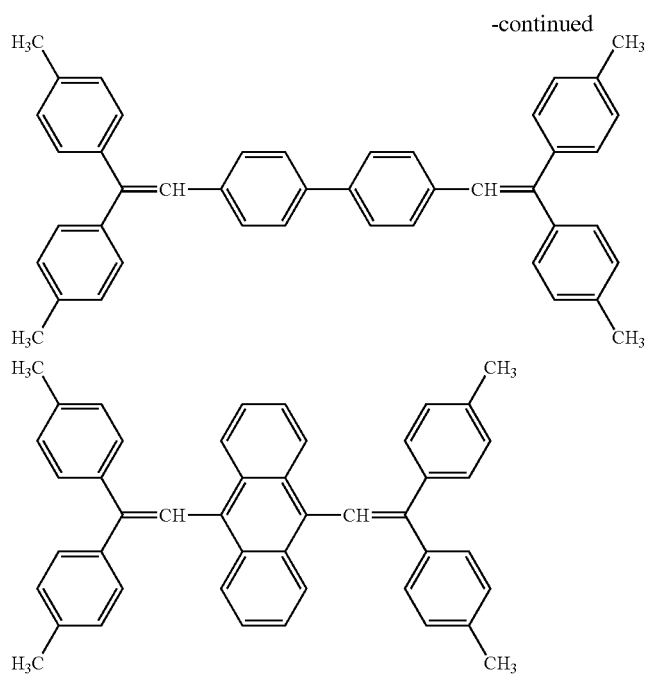
Polymer Light-Emitting Materials
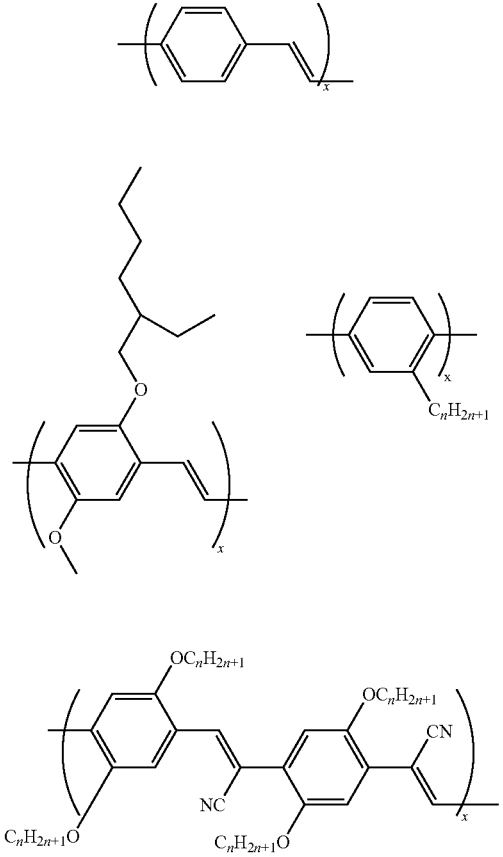
PPV
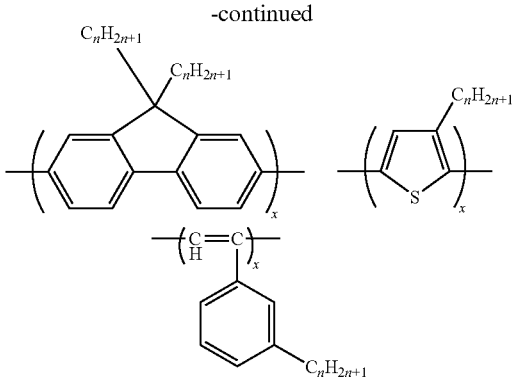
Metal Complex Light-Emitting Materials
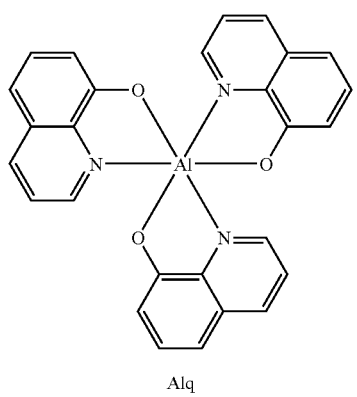
Alq

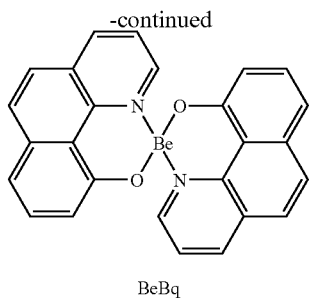

BeBq

The material for injecting and transporting electrons can be arbitrarily selected from the materials that facilitate the injection of electrons from the cathode and have the ability of transporting the injected electrons to the light-emitting layer, taking into account the effect of the carrier mobility of the hole-transporting material. Examples of the materials having the ability of injecting and transporting electrons used in combination with the organic compound expressed by general formula [1] include, but are not limited to, oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives, and organic metal complexes. Some of these compounds will be shown below:

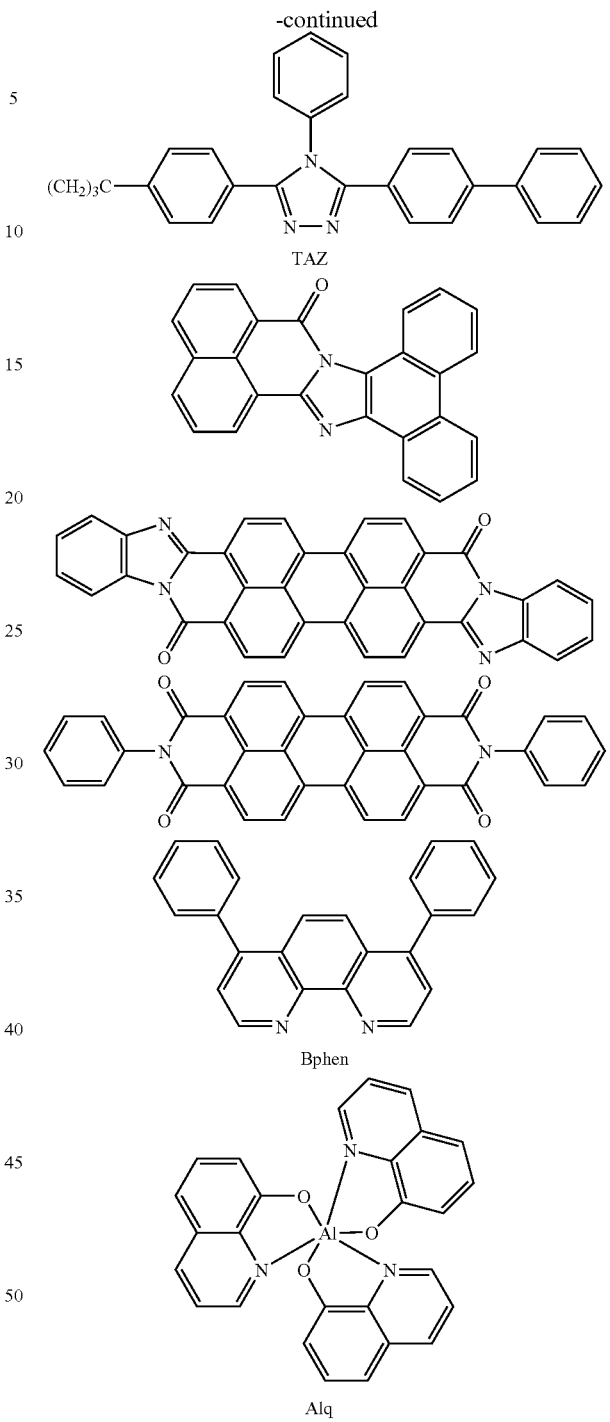

In the organic light-emitting element, the organic compound layer containing the compound expressed by general formula [1] and other organic compound layers are commonly formed to a thin layer by vacuum vapor deposition, ionized vapor deposition, sputtering, plasma coating, or known coating of a material dissolved in a solvent (such as spin coating, dipping, casting, LB (Langmuir-Blodgett) method, or ink jetting method). For the formation of the organic compound layers by coating, an appropriate binder resin may be combined with the desired compounds.

The binder resin can be selected from a variety of binder resins. Exemplary binder resins include, but are not limited to, polyvinylcarbazole, polycarbonate, polyester, polyacrylate, polystyrene, ABS resin, polybutadiene, polyurethane, acrylic resin, methacryl, butyral, polyvinyl acetal, polyamide, polyimide, polyethylene, polyethersulfone, diallyl phthalate, phenol, epoxy, silicone, polysulfone, and urea. These resins may be used singly, or in combination as a copolymer. A known additive, such as a plasticizer, an antioxidant, or a UV absorber, may be added, if necessary.

A material having a work function as high as possible is suitable as the anode material. Exemplary anode materials include: elemental metals, such as gold, platinum, silver, copper, nickel, palladium, cobalt, selenium, vanadium, and tungsten and their alloys; metal oxides, such as tin oxide, zinc oxide, indium oxide, indium tin oxide (ITO), and indium zinc oxide; and electroconductive polymers, such as polyaniline, polypyrrole, polythiophene, and polyphenylene sulfide. These anode materials may be used singly or in combination. The anode may be constituted of a single layer or a plurality of layers.

The cathode material desirably has a low work function. Exemplary cathode materials include elemental metals, such as lithium, sodium, potassium, calcium, magnesium, aluminum, indium, ruthenium, titanium, manganese, yttrium, silver, lead, tin, and chromium, and their alloys, such as lithium-indium, sodium-potassium, magnesium-silver, aluminum-lithium, aluminum-magnesium, and magnesium-indium. Metal oxides, such as indium tin oxide, may be used. These cathode materials may be used singly or in combination. The cathode may be constituted of a single layer or a plurality of layers.

It is desired that at least one of the anode and the cathode be transparent or semi-transparent.

The substrate of the organic light-emitting element is not particularly limited, and may be an opaque substrate made of a metal, ceramic or the like, or a transparent substrate made of glass, quartz, plastic sheet or the like. The substrate may be provided with a color filter film, a fluorescent color conversion filter film, a dielectric reflector film, and so forth to control the emitted color.

In addition, in order to prevent the resulting element from coming into contact with oxygen, water, or the like, a protective layer or a sealing layer may be provided to the element. The protective layer may be made of a diamond thin film; an organic material, such as a metal oxide or a metal nitride; a polymer film, such as of fluorocarbon polymer, polyparaxylene, polyethylene, silicone, or polystyrene resin; or a photo-curable resin. Alternatively, the entire element may be covered with, for example, glass, a gas-nonpermeable film, or a metal, and sealed with a sealing resin, thus being packaged.

EXAMPLES

The invention will be further described with reference to the following examples. However, the invention is not limited to the following examples.

The compound of the invention can be prepared by halogenating fluoranthene or a fluoranthene derivative with reference to Bull. Chem. Soc. Jpn. 62 (1989) 439, by synthesizing a boronic acid derivative from the resulting compound with reference to Organic Syntheses Via Boranes Volume 3, and then subjecting the boronic acid derivative to the Suzuki coupling reaction (Organic Syntheses Via Boranes Volume 3) and ring formation. These citations are incorporated herein by reference.

Example 1

Synthesizing Exemplary Compound 1

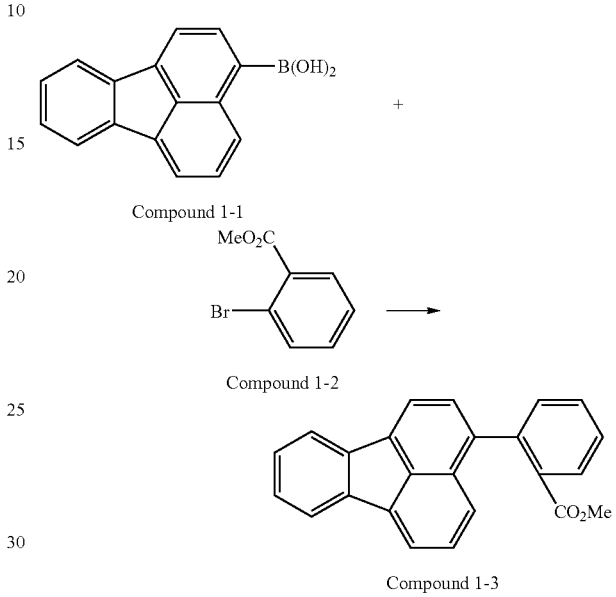

A 100 mL recovery flask was charged with 500 mg (2.03 mmol) of compound 1-1, 974 mg (4.06 mmol) of compound 1-2 (produced by Aldrich), 40.10 g of Pd(PPh3), 10 mL of toluene, 5 mL of ethanol, and 10 mL of 2 mol/L sodium carbonate aqueous solution. The materials were stirred at 60° C. for 8 hours under nitrogen gas flow. After the reaction, the crystals were filtered off, and washed with water, ethanol and toluene. The resulting crystals were vacuum-dried at 120° C. to yield 560 mg of compound 1-3 (yield: 82%).

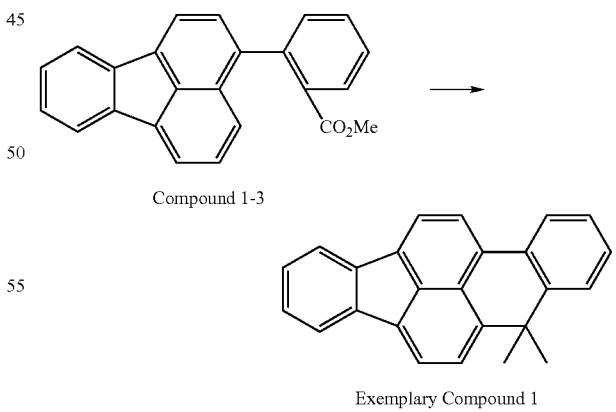

Synthesis of Exemplary Compound 1 from Compound 1-3. A 200 mL recovery flask was charged with 560 mg (1.66 mmol) of compound 1-3 and 100 mL of dehydrated THF. The materials were stirred in a cold bath of −78° C. for 30 minutes in a nitrogen atmosphere. Then, 4.99 mmol of methyl lithium was dripped into the flask, followed by stirring for 30 minutes. The mixture was cooled to room temperature and further stirred for another three hours. After the reaction, 3 mL of water was slowly dripped into the resulting solution in a cold bath of −25° C. Subsequently, ethyl acetate and water was added to the resulting solution, and the organic phase was extracted. The organic phase was dried with magnesium sulfate to remove the solvent.

Subsequently, a 200 mL recovery flask was charged with the product, 50 mL of 90% sulfuric acid, and 20 mL of acetic acid. The materials were stirred for 5 hours in an oil bath of 80° C. After the reaction, ethyl acetate and NaHCO₃ saturated solution were added to the mixture, and the organic phase was extracted and further extracted with water. The organic phase was dried with magnesium sulfate to remove the solvent. The product was purified through a silica gel column chromatography (toluene:heptane=1:3) and its structure was analyzed by NMR. As a result, it was found that 327 mg of exemplary compound 1 was obtained (yield: 62%).

The product was subjected to MALDI-TOF MS (matrix-assisted laser desorption ionization time-of-flight mass spectrometry) and 318.1 representing the M+ (exact mass number) of the product, exemplary compound 1, was observed.

Example 2

In Example 2, an element having the structure shown in FIG. 3 including three organic compound layers was prepared. A 100 nm thick ITO layer was patterned on a glass substrate. The following organic compound layers and electrode layers were continuously formed on the ITO substrate by resistance heating vacuum vapor deposition in a vacuum chamber evacuated to 10⁻⁵ Pa. The opposing electrodes had an area of 3 mm².

Hole transport layer (40 nm): compound 2
Light-emitting layer (50 nm): host, compound 3; guest, exemplary compound 1 (content: 5% on a weight basis)
Electron transport layer (25 nm): compound 4
Metal electrode layer 1 (1 nm): KF
Metal electrode layer 2 (100 nm): Al

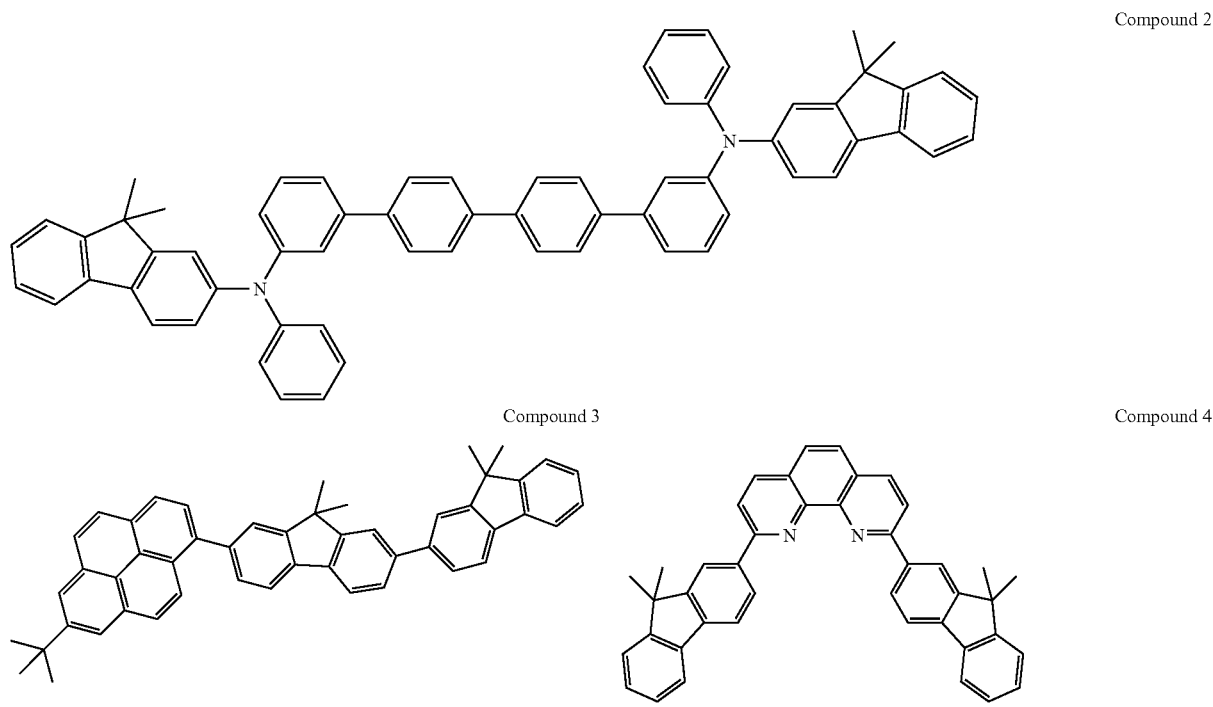

The properties of the resulting organic light-emitting element were measured with a minute current ammeter 4140B manufactured by Hewlett Packard, and the luminance of emitted light was measured with BM7 manufactured by Topcon. As a result, blue light emission with a luminance of 1890 cd/m² was observed at an applied voltage of 4.0 V. Furthermore, a voltage was applied for 100 hours in a nitrogen atmosphere with the current density kept at 30 mA/cm². As a result, the luminance was reduced from an initial luminance 1360 cd/M² to 890 cd/M² after 100 hours.

Example 3

Synthesizing Exemplary Compound 12

Exemplary compound 12 was synthesized in the same manner as in Example 1, except that compound 1-4 was used instead of compound 1-2.

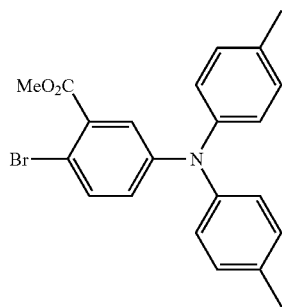

Compound 1-4

Example 4

Synthesizing Exemplary Compound 14

Exemplary compound 14 was synthesized in the same manner as in Example 1, except that compound 1-5 was used instead of compound 1-2.

Compound 1-5

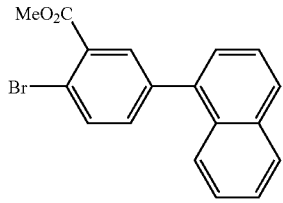

Example 5

Synthesizing Exemplary Compound 21

Exemplary compound 21 was synthesized in the same manner as in Example 1, except that compound 1-6 was used instead of compound 1-2.

Compound 1-6

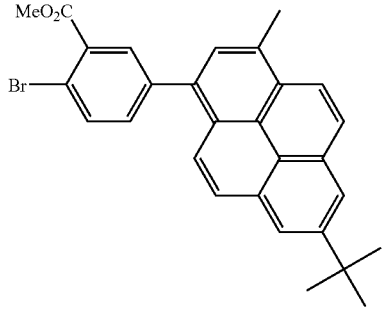

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-125012 filed Apr. 28, 2006, which is hereby incorporated by reference herein in its entirety.

What is claimed is:

1. An organic compound of general formula [1]:

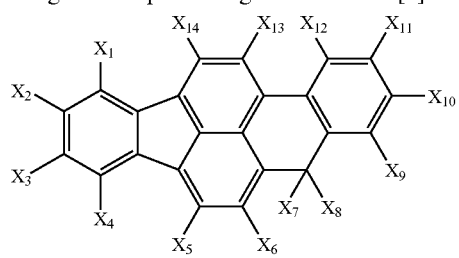

[1]

wherein $X_1$ to $X_6$ and $X_9$ to $X_{14}$ each represent a substituent (A) selected from the group consisting of hydrogen, halogen, straight-chain alkyl, branched alkyl, cyclic alkyl, substituted or unsubstituted aryl, substituted or unsubstituted alkoxy, substituted or unsubstituted heterocyclic, substituted or unsubstituted amino, and substituted or unsubstituted cyano; $X_7$ and $X_8$ are each the substituent (A) excluding hydrogen; and $X_1$ to $X_{14}$ may be the same or different.

2. An organic light-emitting element comprising:
an anode and cathode pair, at least one of the pair being transparent or semi-transparent; and
an organic compound layer disposed between the anode and the cathode, the organic compound layer containing the organic compound as set forth in claim 1.

3. An organic light-emitting element comprising:
an anode and cathode pair, at least one of the pair being transparent or semi-transparent; and
a plurality of organic compound layers including a light-emitting layer, the light-emitting layer containing the compound of claim 1.

4. An organic compound according to claim 1, wherein the organic compound is represented by one of the following chemical structures:

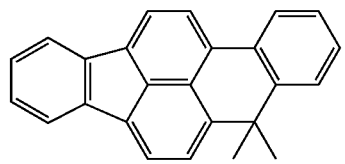

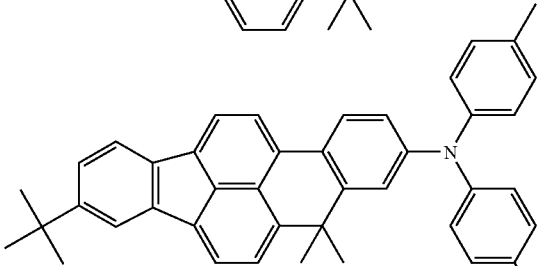

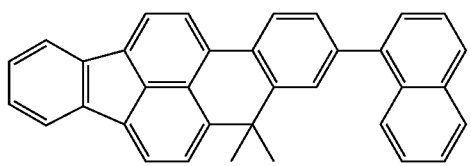

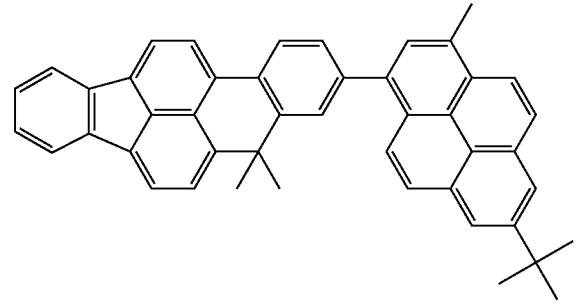

5. An organic light-emitting element comprising:
an anode and cathode pair, at least one of the pair being transparent or semi-transparent; and
an organic compound layer disposed between the anode and the cathode, the organic compound layer containing the organic compound as set forth in claim 4.

6. An organic light-emitting element comprising:
an anode and cathode pair, at least one of the pair being transparent or semi-transparent; and
a plurality of organic compound layers including a light-emitting layer, the light-emitting layer containing the compound of claim 4.

* * * * *